(12) United States Patent
Cao et al.

(10) Patent No.: US 9,839,122 B2
(45) Date of Patent: *Dec. 5, 2017

(54) FLEXIBLE PRINTED CIRCUIT BOARD AND LIQUID CRYSTAL DISPLAY

(71) Applicant: Shenzhen China Star Optoelectronics Technology Co., Ltd., Shenzhen, Guangdong (CN)

(72) Inventors: Hongrui Cao, Guangdong (CN); Xiaoping Tan, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 229 days.

This patent is subject to a terminal disclaimer.

(21) Appl. No.: 14/437,824

(22) PCT Filed: Jan. 12, 2015

(86) PCT No.: PCT/CN2015/070521
§ 371 (c)(1),
(2) Date: Apr. 22, 2015

(87) PCT Pub. No.: WO2016/106826
PCT Pub. Date: Jul. 7, 2016

(65) Prior Publication Data
US 2016/0345432 A1    Nov. 24, 2016

(30) Foreign Application Priority Data
Dec. 31, 2014    (CN) .......................... 2014 1 0856672

(51) Int. Cl.
G02F 1/1345    (2006.01)
H05K 1/02    (2006.01)
H05K 1/11    (2006.01)
H05K 1/09    (2006.01)
H05K 1/14    (2006.01)

(52) U.S. Cl.
CPC ....... *H05K 1/0296* (2013.01); *G02F 1/13452* (2013.01); *G02F 1/13458* (2013.01);
(Continued)

(58) Field of Classification Search
CPC ...... H05K 1/0296; H05K 1/0253; H05K 1/09; H05K 2201/09727; H05K 2201/094;
(Continued)

(56) References Cited

U.S. PATENT DOCUMENTS 4,586,789 A    5/1986    Kishimoto et al.
7,630,048 B2 *    12/2009    Hong .................... G02F 1/1345
                                                            349/149

(Continued)

FOREIGN PATENT DOCUMENTS

CN    201145789 Y    11/2008
CN    201821575 U    5/2011
(Continued)

*Primary Examiner* — Jia Pan
(74) *Attorney, Agent, or Firm* — Andrew C. Cheng

(57) ABSTRACT

The disclosure is related to a flexible printed circuit board. The flexible printed circuit board comprises a connecting area and a plurality of gold fingers disposed inside the connecting area, wherein the distances of the gold fingers are different. The disclosure is further related to a liquid crystal display. By the above manner, the disclosure is able to change the distances between the adjacent gold fingers to increase the number of the gold fingers without changing the size of the flexible printed circuit board so as to solve the impedance matching problem of the gold fingers of the flexible printed circuit board, and in the meanwhile to increase the assembling yield rate of the flexible printed circuit board.

4 Claims, 3 Drawing Sheets

(52) U.S. Cl.
CPC ............ *H05K 1/025* (2013.01); *H05K 1/028* (2013.01); *H05K 1/09* (2013.01); *H05K 1/117* (2013.01); *H05K 1/147* (2013.01); *H05K 1/0245* (2013.01); *H05K 2201/05* (2013.01); *H05K 2201/10136* (2013.01)

(58) Field of Classification Search
CPC .......... H05K 1/028; H05K 1/11; H05K 1/118; H05K 1/189; H05K 3/361; H05K 2201/05; H05K 1/0393; H05K 2201/2009; H05K 1/117; H05K 1/0295; H05K 2201/09954; H05K 2201/09145; H05K 3/363; H05K 2201/097; G02F 1/133; Y10T 29/49124; H01L 23/4985; H01R 12/721
See application file for complete search history.

(56) References Cited

U.S. PATENT DOCUMENTS

| | | | |
|---|---|---|---|
| 2004/0036833 A1* | 2/2004 | Monzen ............ | G02F 1/13452 349/158 |
| 2006/0248179 A1* | 11/2006 | Short ................ | H04L 63/1416 709/223 |
| 2007/0097309 A1* | 5/2007 | Matsumoto ......... | G02F 1/13452 349/149 |
| 2007/0197058 A1* | 8/2007 | Kitada .................. | H05K 3/363 439/76.2 |
| 2008/0084530 A1* | 4/2008 | Hirabayashi ......... | H01R 13/025 349/150 |
| 2008/0102653 A1* | 5/2008 | Adulami ................ | H05K 1/117 439/59 |
| 2008/0180627 A1 | 7/2008 | Yasuda et al. | |
| 2009/0147204 A1* | 6/2009 | Kang .................. | G02F 1/13452 349/150 |
| 2010/0035446 A1 | 2/2010 | Lo et al. | |
| 2013/0093990 A1* | 4/2013 | Chen ..................... | H05K 1/117 349/150 |
| 2013/0306360 A1* | 11/2013 | Tan ..................... | H01L 23/4985 174/254 |
| 2016/0349553 A1 | 12/2016 | Cao | |

FOREIGN PATENT DOCUMENTS

| | | |
|---|---|---|
| JP | H05145209 A | 6/1993 |
| JP | H09246676 A | 9/1997 |
| WO | 2008078427 A1 | 7/2008 |

* cited by examiner

FLEXIBLE PRINTED CIRCUIT BOARD AND LIQUID CRYSTAL DISPLAY

BACKGROUND

Technical Field

The disclosure is related to liquid crystal technology field, and more particular to a flexible printed circuit board and a liquid crystal display using the same.

Related Art

With the development of technology, the liquid crystal displays (LCD) have been used in public life. In order to satisfy the requirement, the resolution of the liquid crystal displays are increased gradually, such as the resolution of the liquid crystal displays from qHD (Quarter High Definition, the screen resolution of a digital product) to HD (High Definition), or that from WXGA (Wide Extended Graphics Array, widescreen) to WUXGA (Widescreen Ultra eXtended Graphics Array). Increasing the resolution of the LCDs have consequently doubled the number of differential lines, such that the number of the gold fingers of the flexible printed circuit board must be increased.

However, the size of the flexible printed circuit board is fixed. In order to increase the resolution of the liquid crystal display, it is necessary to increase the number of gold fingers on the flexible printed circuit board. Nevertheless, in order to satisfy to increase the number of the gold fingers, the size of the flexible printed circuit board must be increased. It is easy to increase the cost. Additionally, since the gold fingers of the flexible printed circuit board are increased, it must affect the impedance of the gold finger area. Therefore, with increase of the resolution of the liquid crystal display, the impedance matching of the gold finger area has become a major problem.

In summary, it is desirous to provide a flexible printed circuit board and a liquid crystal display to solve the above problem.

SUMMARY

The technique problem solved by the disclosure is to provide a flexible printed circuit board and a liquid crystal display which is able to increase the number of the gold fingers without changing the size of the flexible printed circuit board so as to solve the impedance matching problem of the flexible printed circuit board effectively.

In order to solve the above technique problem, the disclosure provides a flexible printed circuit board which comprises a connecting area and a plurality of gold fingers separately disposed inside the connecting area, wherein distances between the adjacent gold fingers are different; widths of the gold fingers are different; the gold fingers comprises first gold fingers for transmitting differential signals and second gold fingers for transmitting other signals beside the differential signals; wherein distances between two of the adjacent first gold fingers are greater than distances between two of the adjacent second gold fingers or distances between the first gold fingers adjacent to the second gold fingers.

In one embodiment, the gold fingers are aligned with each other and arranged on the connecting area.

In order to solve the above technique problem, the disclosure further provides a flexible printed circuit board which comprises the flexible printed circuit board comprising a connecting area and a plurality of gold fingers separately disposed inside the connecting area, wherein distances of the adjacent gold fingers are different.

In one embodiment, the gold fingers comprises first gold fingers for transmitting differential signals and second gold fingers for transmitting other signals beside the differential signals; wherein distances between two of the adjacent first gold fingers are greater than distances between two of the adjacent second gold fingers or distances between the first gold fingers adjacent to the second gold fingers.

In one embodiment, the first gold fingers are located on a center region or two sides of the connecting area.

In one embodiment, the first gold fingers are staggered and arranged on the connecting area, and the second gold fingers are staggered and arranged on the connecting area.

In one embodiment, the distances of the gold finger are increased gradually from a center region to two sides of the connecting area.

In one embodiment, widths between the adjacent gold fingers are different.

In one embodiment, the gold fingers comprises first gold fingers for transmitting differential signals and second gold fingers for transmitting other signals beside the differential signals; wherein widths of the first gold fingers are greater than widths of the second gold fingers.

In one embodiment, the first gold fingers are located on the center region or two sides of the connecting area.

In one embodiment, the first gold fingers are staggered and arranged on the connecting area, the second gold fingers are staggered and arranged on the connecting area.

In order to solve the above technique problem, the disclosure further provides a liquid crystal display which comprises a liquid crystal panel and a flexible printed circuit board connected to the liquid crystal panel, the flexible printed circuit board comprising a connecting area and a plurality of gold fingers separately disposed inside the connecting area, wherein distances between the gold fingers are different.

In one embodiment, the gold fingers comprises first gold fingers for transmitting differential signals and second gold fingers for transmitting other signals beside the differential signals; wherein distances between the adjacent first gold fingers are greater than distances between the adjacent second gold fingers or distances between the first gold fingers adjacent to the second gold fingers.

In one embodiment, the first gold fingers are located on two sides of the connecting area.

In one embodiment, the first gold fingers are staggered and arranged on the connecting area, and the second gold fingers are staggered and arranged on the connecting area.

In one embodiment, the distances of the gold finger are increased gradually from a center region to two sides of the connecting area.

In one embodiment, widths between the adjacent gold fingers are different.

In one embodiment, the gold fingers comprises first gold fingers for transmitting differential signals and second gold fingers for transmitting other signals beside the differential signals, wherein distances between the adjacent first gold fingers are greater than distances between the adjacent second gold fingers or distances between the first gold fingers adjacent to the second gold fingers.

In one embodiment, the first gold fingers are located on the center region or two sides of the connecting area.

In one embodiment, the first gold fingers are staggered and arranged on the connecting area, and the second gold fingers are staggered and arranged on the connecting area.

The advantageous effects of the disclosure distinguishing from the current technique is that the flexible printed circuit board of the disclosure comprises a connecting area and a plurality of gold fingers disposed inside the connecting area, wherein the distances of the gold fingers are different. By the above manner, the disclosure configures the distances of the gold fingers of the flexible printed circuit board to be different such that it is able to increase the gold fingers without changing the size of the flexible printed circuit board so as to solve the impedance matching problem of the gold fingers of the flexible printed circuit board. In the meanwhile, variation on the distances of the gold fingers change results in more space for assembling the flexible printed circuit board to effectively increase the assembling yield rate of the flexible printed circuit board.

BRIEF DESCRIPTION OF THE DRAWINGS

The above and other exemplary aspects, features and advantages of certain exemplary embodiments of the present disclosure will be more apparent from the following description taken in conjunction with the accompanying drawings, in which.

DETAILED DESCRIPTION

The description and explanation are given in more details in the following with reference to the accompanying drawings.

Figure 1:
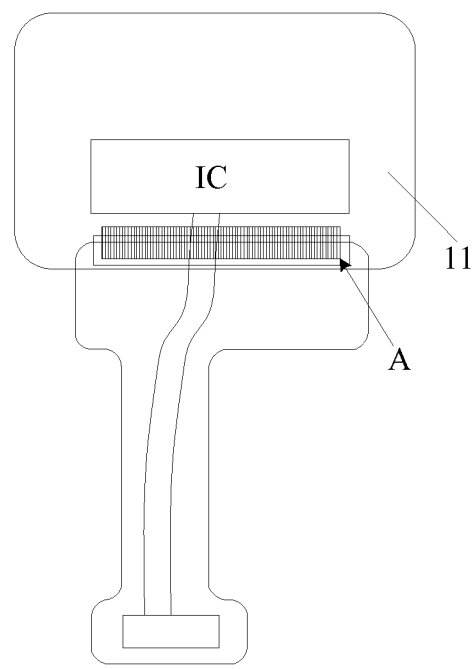
FIG. 1 is a schematic view of the flexible printed circuit board and the liquid crystal display according to the embodiment of the disclosure.
Figure 2:
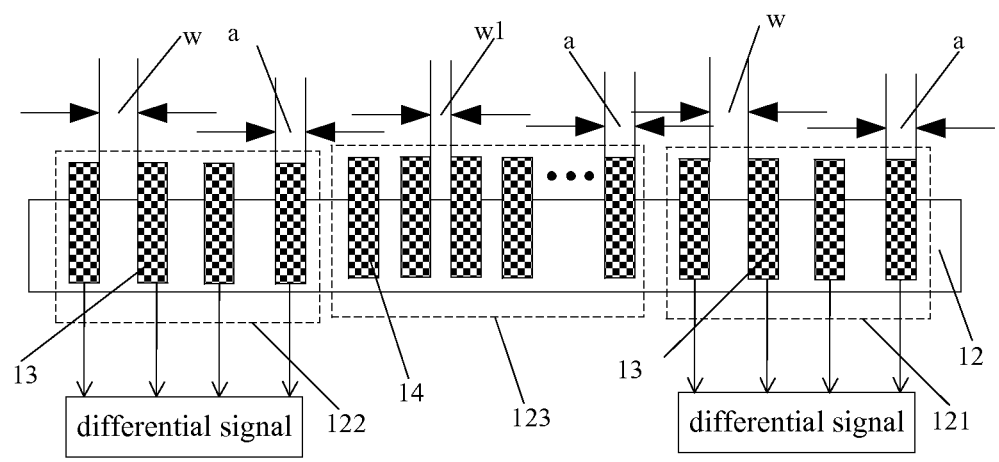
FIG. 2 is a schematic view of the first embodiment of area A in FIG. 1.

As shown in FIGS. 1 and 2, FIG. 1 is a schematic view of the flexible printed circuit board and the liquid crystal display according to the embodiment of the disclosure, FIG. 2 is a schematic view of area A in FIG. 1. The disclosure provides a liquid crystal display. The liquid crystal display comprises a liquid crystal panel 11 and a flexible printed circuit board. The liquid crystal panel 11 is connected to the flexible printed circuit board. The flexible printed circuit board comprises a connecting area 12, and a plurality of gold fingers separately disposed inside the connecting area 12. The gold fingers are used to transmit signals.

The connecting area 12 comprises a first area 121, a second area 122, and a third area 123. The gold fingers include first gold fingers 13 and second gold fingers 14. The first gold fingers are disposed on the first area 121 and the second area 122, and the second gold fingers are disposed on the third area 123. The first gold fingers 13 are used to transmit differential signals, and the second gold fingers 14 are used to transmit other signals beside the differential signals. In this embodiment, the gold fingers are aligned with each other and arranged on the connecting area 12, i.e. the first gold fingers 13 are aligned with each other and arranged on the first area 121 and the second area 122, and the second gold fingers 14 are aligned with each other and arranged on the third area 123.

In this embodiment, distances of the adjacent gold fingers are different. The distance of each of the gold fingers is set to be different according to the importance of the signal transmitted by each of the gold fingers. In one embodiment, the higher the importance of the transmitted signals, the greater the distance between the adjacent gold fingers. In this embodiment, the importance of the differential signals is higher, and the importance of the other signals beside the differential signals is lower. Hence the distances w between two of the adjacent first gold fingers 13 on the first area 121 are greater than the distances w1 between two of the adjacent second gold fingers 14 on the third area 123. In the meanwhile, the distances w between two of the adjacent first gold fingers 13 on the second area 122 are greater than the distances w1 between two of the adjacent second gold fingers 14 on the third area 123. It should be appreciated that "w" is the distance between two of the adjacent first gold fingers 13 which are arranged on the first area 121 and the second area 122, and "w1" is the distance between two of the adjacent second gold fingers which are arranged on the third area 123. In this embodiment, the widths of the gold finger are a, i.e., "a" is the width of the first gold fingers 13 on the first area 121 and the second area 122, and "a" is also the width of the second fingers 14 on the third area 123. Furthermore, the distances w between the adjacent first gold fingers 13 on the first area 121 and the second area 122 are greater than the distance between the first gold finger 13 and the second gold finger 14 adjacent to the first gold finger 13.

In other embodiments, it should be understood that the highest importance of the differential signals is not limitative. The highest importance of the signals is determined mainly according to a layout of signal transmitting lines inside the practical flexible printed circuit board.

That is to say the first gold fingers 13 in this embodiment are arranged on the two sides of the connecting area 12, and the distances between the adjacent gold fingers are increased gradually from the center region of the connection area 12 to the two sides of the connecting area 12. By of way this manner, more space may be available on the flexible printed circuit board through the variation on the distances of the adjacent gold fingers under the same size of the flexible printed circuit board. This facilitates to add elements or modify the relevant elements on the flexible printed circuit board such that the assembly yield rate is increased effectively, and in the meanwhile the problem of the impedance matching of the gold fingers is also solved.

It should be appreciated that the first gold fingers may be arranged on the first area 121, or may also be arranged on the second area 122.

In this embodiment, the distances of the adjacent first gold fingers 13 located on the two sides of the connecting area 12 do not change, and then the distances of the adjacent second gold fingers 14 are decreased to obtain enough distances on the center region of the connecting area 12, so as to increase or modify the other elements on the center region of the connecting area 12. This may greatly increase the assembling yield rate for the flexible printed circuit board, and in the meanwhile may solve the impedance matching problem of the flexible printed circuit board when the number of the gold fingers is increased.

Figure 3:
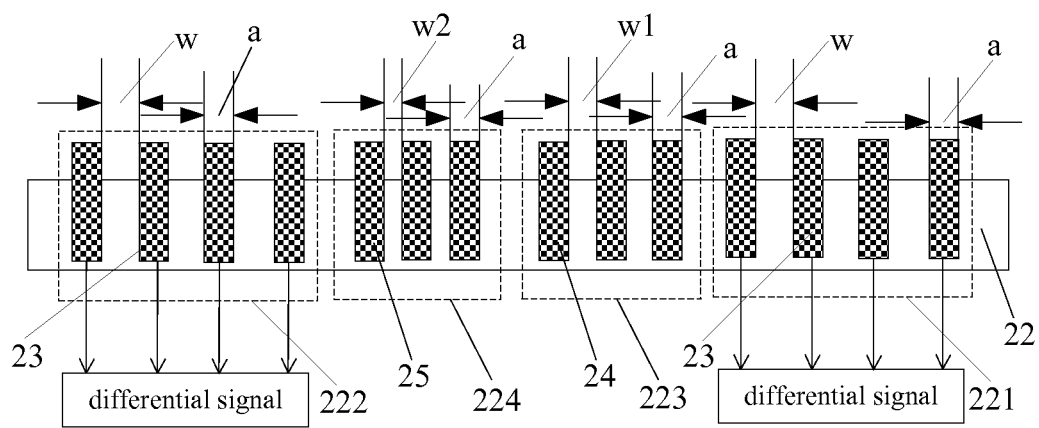
FIG. 3 is a schematic view of the second embodiment of area A in FIG. 1.

As shown in FIG. 3, FIG. 3 is a schematic view of the second embodiment of area A in FIG. 1. The difference between FIG. 2 and FIG. 3 is that a ratio of the distances of the adjacent gold fingers is increased or decreased gradually according to the importance of the signals transmitted by each of the gold fingers. Namely, the connecting area 22 comprises a first area 221, a second area 222, a third area 223, and a forth area 224. The gold fingers include first gold fingers 23, second gold fingers 24 and third gold fingers 25.

The first gold fingers 23 are disposed on the first area 221 and the second area 222. That is the first gold fingers 23 are arranged on the two sides of the connecting area 22. The second gold fingers 24 are disposed on the third area 223, and the third gold fingers 25 are disposed on the forth area 224. The first gold fingers 23 are used to transmit differential signals, the second gold fingers 24 are used to transmit first signals, and the third gold fingers 25 are used to transmit second signals. In this embodiment, the gold fingers are aligned with each other and arranged on the connecting area 22, i.e. the first gold fingers 23 are aligned with each other and arranged on the first area 221 and the second area 222. The second gold fingers 24 are aligned with each other and arranged on the third area 223, and the third gold fingers 25 are aligned with each other and arranged on the forth area 224.

In this embodiment, the importance of the differential signals is highest, the importance of the second signals is medium, and the importance of the second signals is lowest. Therefore, the distances w between two of the adjacent first gold fingers 23 on the first area 221 and the second area 222 are greater than the distances w1 between two of the adjacent second gold fingers 24 on the third area 223, and the distances w1 between two of the adjacent second gold fingers 24 are greater than the distances w2 between two of the third gold fingers 25 on the forth area 224. In one embodiment, the distances w between two of the adjacent first gold fingers 23, the distances w1 between two of the adjacent second gold fingers 24, and the distances w2 between two of the adjacent third gold fingers 25 are decreased proportionally. Or the distances w between two of the adjacent first gold fingers 23, the distances w1 between two of the adjacent second gold fingers 24, and the distances w2 between two of the adjacent third gold fingers 25 are determined by using arithmetic progression. It should be noted that the widths of the first gold fingers 23, the second gold fingers 24, and the third gold fingers 25 are a. Further, the distances w between two of the adjacent first gold fingers 23 are greater than the distances between the first gold fingers 23 and the second gold fingers 24 adjacent to the first gold fingers 23. In the meanwhile, the distances w between two of the adjacent first gold fingers 23 are greater than the distances between the first gold fingers 23 and the third gold fingers 25 adjacent to the first gold fingers 23.

It should be appreciated that in other embodiments that the high importance of the differential signals, and the medium importance of the first siganls and the low importance of the second signals insides the flexible printed circuit board are not limitative. The importance of the signals are determined mainly according to a layout of signal transmitting lines insides the practical flexible printed circuit board, i.e. the importance of the first signals may also be high, or the importance of the second signals may also be high. Additionally, the first gold fingers 23 may be located on the first area 221, or the first gold fingers 23 may also be located on the second area 222.

In this embodiment, the distances w between two of the adjacent first gold fingers 23, the distances w1 between two of the second gold fingers 24 and the distances w2 between two of the third gold fingers 25 are decreased gradually to increase the assembling yield rate and solve the impedance matching problem of the flexible printed circuit board; meanwhile, since the distances between two of the adjacent gold fingers are configured to be propotionl, the sizes of the distances between two of the adjacent gold fingers are controlled better and the process efficiency may increased effectively.

Figure 4:
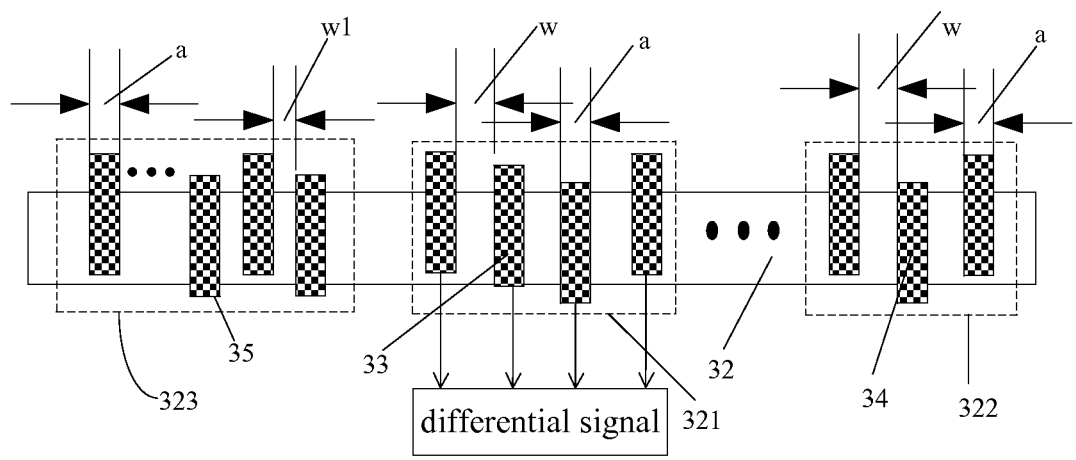
FIG. 4 is a schematic view of the third embodiment of area A in FIG. 1.

As shown in FIG. 4, FIG. 4 is a schematic view of the third embodiment of area A in FIG. 1. The difference between FIG. 4 and FIG. 2 is that the distances of the highest importance of the adjacent gold fingers and the distances of the lowest importance of the distances of the adjacent gold fingers are different and the gold fingers are staggered and arranged on the connecting area 32. Specifically, the connecting area 32 comprises a first area 321, a plurality of second area 322 and a third area 323. The gold fingers include first gold fingers 33, second gold fingers 34 and third gold fingers 35. The first gold fingers 33 are staggered and arranged on the first area 321. That is the first gold fingers 33 are on the center region of the connecting area 32. The second gold fingers 34 are staggered and arranged on the second area 322. The third gold fingers 35 are staggered and arranged on the third area 323. The first gold fingers 33 are used to transmit differential signals, the second gold fingers 34 are used to transmit first signals, and the third gold fingers 35 are used to transmit second signals.

In this embodiment, the importance of the differential signals is highest, and the importance of the second signals is lowest. Therefore, the distances w between two of the adjacent first gold fingers are greater than the distances w1 between two of the adjacent third gold fingers 35. In one embodiment, the distances w between two of the adjacent first gold fingers and the distances w1 between two of the adjacent third gold fingers 35 are set to be proportional. That is the distances w between two of the adjacent first gold fingers is a multiple of the distances w1 between two of the adjacent third gold fingers 35, for example two times, three times, four times or more times. Furthermore, the distances between two of the adjacent first gold fingers 33 and the second gold fingers 34 of the second area 322 are equivalent, all being w. In the meanwhile, the widths of the first gold fingers 33, the widths of the second gold fingers 34, and the widths of the third gold fingers 35 are all a.

In other embodiments, it should be understood that the highest importance of the differential signals and the lowest importance of the second signals are not limitative. The highest importance and the lowest importance of the signals are determined mainly according to a layout of the signal transmitting lines insides the practical flexible printed circuit board, i.e. the highest importance of the signals may be the first signals, the lowest importance of the signals may also be the third signals according the layout of the practical flexible printed circuit board.

In this embodiment, the distances between two of the highest importance of the adjacent gold fingers and the distances between two of the lowest importance of the gold fingers are different to increase the assembling yield rate and to solve the impedance matching problem of the flexible printed circuit board; meanwhile, since only the distances between two of the highest importance of the gold fingers and the distances between two of the lowest importance of the gold fingers are set, the sizes of the distances between two of the adjacent gold fingers are controlled promptly and the process efficiency may increase effectively. Additionally, the gold fingers are staggered and arranged to provide more space between the gold fingers so as to decrease the interference between the adjacent gold fingers.

Figure 5:
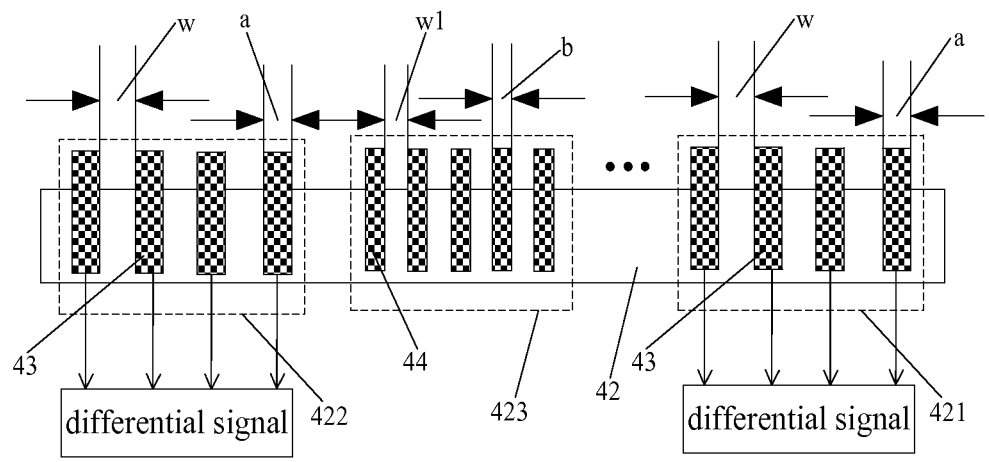
FIG. 5 is a schematic view of the fourth embodiment of area A in FIG. 1.

As shown in FIG. 5, FIG. 5 is a schematic view of the fourth embodiment of area A in FIG. 1. The difference between FIG. 5 and FIG. 2 is that the widths of the gold fingers are different, and the distances between the adjacent gold fingers are different.

In one embodiment, the distances between of the gold fingers adjacent to each other are set to be different according to the importance of each of the signals transmitted by the gold fingers; meanwhile, the widths of the fingers are also set to be different according to the importance of each of the signals transmitted by the gold fingers. The more important the signals need to be transmitted, the greater distances between two of the adjacent gold fingers, also greater widths of the glos fingers, The gold fingers comprises first gold fingers 43 for transmitting differential signals and second gold fingers 44 for transmitting other signals beside the differential signals. The connecting area 42 comprises a first area 421, a second area 422 and a third area 423. The first gold fingers 43 are disposed on the first area 421 and the second area 422, i.e. the first gold fingers 43 are located on two sides of the connecting area 42, and the second gold fingers 44 are disposed on the third area 423. In this embodiment, the gold fingers are aligned with each other and arranged on the connecting area 42, i.e. the first gold fingers 43 are aligned with each other and arranged on the first area 421 and the second area 422, and the second gold fingers 44 are aligned with each other and arranged on the third area 423.

In this embodiment, the importance of the differential signals is higher, and the importance of other signals beside the differential signals is lower. In one embodiment, the distances between the adjacent gold fingers are increased gradually from the center region to the two sides of the connecting area 42. Therefore, the distances w between the adjacent first gold fingers 43 are greater than the distances w1 between the adjacent second gold fingers 44 or the distances w between the adjacent first gold fingers 43 are greater than the distances between the first gold fingers 43 and the second gold fingers 44 adjacent to the first gold fingers 43; meanwhile, the widths a of the first gold fingers 43 are greater than the width b of the second gold fingers 44. In one embodiment, the widths a of the first gold fingers 43 are proportional to the width b of the second gold fingers 44, i.e. the widths a of the first gold fingers 43 are 1.5 times, 2 times, 3 times or more times of the widths b of the second gold fingers 44; the distances w between the first gold fingers 43 are proportional to the distances w1 of the second gold fingers 44, i.e. the distances w of the first gold fingers are 1.5 times, 2 times, 3 times or more times of the distances w1 of the second gold fingers 44.

In other embodiments, it should be understood that the first gold fingers may be disposed on the first area 421, and the second gold fingers 44 are disposed on the second area 422 and the third area 423. Or the first gold fingers 43 may be disposed on the third area 423, and the second gold fingers 44 are disposed on the first area 421 and the second area 422.

The disclosure set the distances between the gold fingers and the widths of the gold finger to be different at the same time to make the flexible printed circuit board to have enough space, so as to increase the assembling yield of the flexible printed circuit board.

Figure 6:
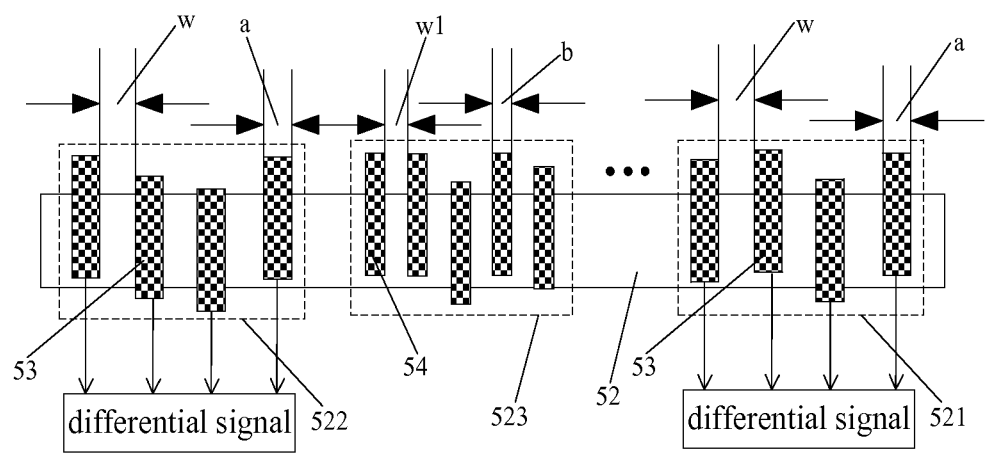
FIG. 6 is a schematic view of the fifth embodiment of area A in FIG. 1.

As shown in FIG. 6, FIG. 6 is a schematic view of the fifth embodiment of area A in FIG. 1. The difference between FIG. 6 and FIG. 5 is that the gold fingers are staggered and arranged on the connecting area 52, i.e. the first gold fingers 53 are staggered and arranged on the first area 521 and the second area 522, and the second gold fingers 54 are staggered and arranged on the second area 522.

In summary, according to the disclosure, the flexible printed circuit board comprises a connecting area and a plurality of gold fingers disposed inside the connecting area, wherein the distances of the adjacent gold fingers are different. By the above manner, the disclosure configures the distances of the gold fingers of the flexible printed circuit board to be different such that it is able to increase the gold fingers without changing the size of the flexible printed circuit board so as to solve the impedance matching problem of the gold fingers of the flexible printed circuit board. In the meanwhile, variation on the distances of the gold fingers change results in more space for assembling the flexible printed circuit board to effectively increase the assembling yield rate of the flexible printed circuit board.

Note that the specifications relating to the above embodiments should be construed as exemplary rather than as limitative of the present disclosure. The equivalent variations and modifications on the structures or the process by reference to the specification and the drawings of the disclosure, or application to the other relevant technology fields directly or indirectly should be construed similarly as falling within the protection scope of the disclosure.

What is claimed is:

1. A flexible printed circuit board, comprising a connecting area and a plurality of gold fingers separately disposed inside the connecting area, wherein the distances of the adjacent gold fingers are different;
    wherein the distances of the adjacent gold fingers are increased gradually from the center region to the two sides of the connecting area;
    wherein the plurality of gold fingers comprising first gold fingers for transmitting differential signals and second gold fingers for transmitting other signals beside the differential signals; wherein the distances of the adjacent first gold fingers are greater than the distances of the adjacent second gold fingers, and the distances between the first gold fingers and the second gold fingers adjacent to the first gold fingers.

2. The flexible printed circuit board according to claim 1, wherein the first gold fingers are located on two sides of the connecting area.

3. A liquid crystal display, wherein the liquid crystal display comprising a liquid crystal panel and a flexible printed circuit board connected to the liquid crystal panel, the flexible printed circuit board comprising a connecting area and a plurality of gold fingers separately disposed inside the connecting area, wherein the distances of the adjacent gold fingers are different;
    wherein the distances of the adjacent gold fingers are increased gradually from the center region to the two sides of the connecting area;
    wherein the plurality of gold fingers comprising first gold fingers for transmitting differential signals and second gold fingers for transmitting other signals beside the differential signals; wherein the distances of the adjacent first gold fingers are greater than the distances of the adjacent second gold fingers, and the distances between the first gold fingers and the second gold fingers adjacent to the first gold fingers.

4. The liquid crystal display according to claim 3, wherein the first gold fingers are located on two sides of the connecting area.

* * * * *